(12) United States Patent
Campbell et al.

(10) Patent No.: US 8,619,425 B2
(45) Date of Patent: Dec. 31, 2013

(54) MULTI-FLUID, TWO-PHASE IMMERSION-COOLING OF ELECTRONIC COMPONENT(S)

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 13/281,945

(22) Filed: Oct. 26, 2011

(65) Prior Publication Data
US 2013/0105120 A1  May 2, 2013

(51) Int. Cl.
*H05K 7/20* (2006.01)

(52) U.S. Cl.
USPC .......... 361/699; 361/689; 361/700; 361/707; 361/708; 165/80.4

(58) Field of Classification Search
None
See application file for complete search history.

(56) References Cited

U.S. PATENT DOCUMENTS

| | | | |
|---|---|---|---|
| 3,741,292 A | | 6/1973 | Aakalu et al. |
| 3,851,221 A | * | 11/1974 | Beaulieu et al. ......... 361/679.31 |
| 4,103,737 A | * | 8/1978 | Perkins ....................... 165/109.1 |
| 4,704,658 A | * | 11/1987 | Yokouchi et al. ............. 361/698 |
| 4,949,164 A | * | 8/1990 | Ohashi et al. .................. 257/715 |
| 5,349,499 A | | 9/1994 | Yamada et al. |
| 5,411,077 A | * | 5/1995 | Tousignant .............. 165/104.33 |
| 7,035,104 B2 | | 4/2006 | Meyer |
| 7,284,389 B2 | * | 10/2007 | Sharma et al. ................... 62/310 |
| 7,492,594 B2 | * | 2/2009 | Pal ................................ 361/699 |
| 7,561,425 B2 | | 7/2009 | Mindock et al. |
| 7,885,070 B2 | | 2/2011 | Campbell et al. |
| 7,916,483 B2 | | 3/2011 | Campbell et al. |
| 7,944,694 B2 | | 5/2011 | Campbell et al. |
| 7,948,757 B2 | | 5/2011 | Campbell et al. |

(Continued)

OTHER PUBLICATIONS

Simons et al., "A Survey of Vapor Phase Cooling Systems", EDN Magazine, vol. 14, No. 1, pp. 53-56 (Jan. 1969).

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

Cooling apparatuses and methods are provided for immersion-cooling one or more electronic components. The cooling apparatus includes a housing at least partially surrounding and forming a fluid-tight compartment about the electronic component(s), and a boiling fluid mixture of first and second dielectric fluids within the fluid-tight compartment, with the electronic component(s) immersed within the mixture. A condensing fluid is also provided within the fluid-tight compartment, and is immiscible with the boiling fluid mixture. The condensing fluid has a lower specific gravity and a higher thermal conductivity than the boiling fluid mixture, and facilitates condensing of vaporized boiling fluid mixture. A cooling structure is provided within the compartment, and includes a condensing region and a sub-cooling region, with the condensing region being in contact with the condensing fluid, and the sub-cooling region being in contact with the boiling fluid mixture. The cooling structure facilitates heat removal from the fluid-tight compartment.

20 Claims, 13 Drawing Sheets

(56) References Cited

U.S. PATENT DOCUMENTS

| | | | |
|---|---|---|---|
| 7,961,475 B2 | 6/2011 | Campbell et al. | |
| 7,983,040 B2 | 7/2011 | Campbell et al. | |
| 8,345,425 B2 * | 1/2013 | Toyoda et al. | 361/700 |
| 2007/0153480 A1 * | 7/2007 | Zhang et al. | 361/700 |
| 2011/0103019 A1 | 5/2011 | Campbell et al. | |

OTHER PUBLICATIONS

Crispell et al., "Use of Liquid Metal to Promote Boiling on Immersed Integrated Circuit Chips", IBM Technical Disclosure Bulletin, IPCOM000058250D, TDB 09-88, pp. 365-366 (Sep. 1, 1988).

Mudawar, et al., "Immersion-Cooled Standard Electronic Clamshell Module: A Building Block for Future High-Flux Avionic Systems", Journal of Electronic Packaging, vol. 116, pp. 116-125 (Jun. 1994).

Geisler et al., "Passive Immersion Cooling of 3-D Stacked Dies", IEEE Transactions on Components and Packaging Technologies, vol. 32, No. 3, pp. 557-565 (Sep. 2009).

Forrest et al., "Pressure Effects on the Pool of Boiling of the Fluorinated Ketone", Thermal and Thermomechanical Phenomena in Electronic Systems (ITherm), pp. 1-9 (2010).

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

* cited by examiner

MULTI-FLUID, TWO-PHASE IMMERSION-COOLING OF ELECTRONIC COMPONENT(S)

BACKGROUND

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through the provision of a cooling apparatus comprising a housing configured to at least partially surround and form a fluid-tight compartment about at least one electronic component. A boiling fluid mixture comprising a first dielectric fluid and a second dielectric fluid is disposed within the fluid-tight compartment, with the at least one electronic component being immersed within the boiling fluid mixture. The cooling apparatus further includes a condensing fluid and a cooling structure. The condensing fluid is disposed within the fluid-tight compartment, and is immiscible with the boiling fluid mixture. The condensing fluid comprises a lower specific gravity and a higher thermal conductivity than that of the boiling fluid mixture, and facilitates condensing of vaporized boiling fluid mixture within the fluid-tight compartment. The cooling structure is disposed within the fluid-tight compartment, and includes a condensing region and a sub-cooling region. The condensing region is in contact with the condensing fluid, and the sub-cooling region is in contact with the boiling fluid mixture. The cooling structure facilitates heat removal from the fluid-tight compartment.

In another aspect, a liquid-cooled electronic system is provided which includes an electronics rack comprising at least one electronic component to be cooled, and a cooling apparatus immersion-cooling the at least one electronic component. The cooling apparatus includes a housing at least partially surrounding and forming a fluid-tight compartment about the at least one electronic component, and a boiling fluid mixture comprising a first dielectric fluid and a second dielectric fluid disposed within the fluid-tight compartment. The at least one electronic component is immersed within the boiling fluid mixture. The cooling apparatus further includes a condensing fluid and a cooling structure. The condensing fluid is disposed within the fluid-tight compartment, and is immiscible with the boiling fluid mixture. The condensing fluid comprises a lower specific gravity and a higher thermal conductivity than that of the boiling fluid mixture, and facilitates condensing of vaporized boiling fluid mixture within the fluid-tight compartment. The cooling structure is disposed within the fluid-tight compartment, and includes a condensing region and a sub-cooling region. The condensing region is in contact with the condensing fluid, and the sub-cooling region is in contact with the boiling fluid mixture. The cooling structure facilitates heat removal from the fluid-tight compartment.

In a further aspect, a method of facilitating cooling of at least one electronic component is provided. The method includes: providing a housing at least partially surrounding and forming a fluid-tight compartment about the at least one electronic component to be cooled; providing a boiling fluid mixture comprising a first dielectric fluid and a second dielectric fluid that comprises a desired boiling temperature, the first dielectric fluid and the second dielectric fluid being miscible; immersing the at least one electronic component within the boiling fluid mixture; providing a condensing fluid disposed within the fluid-tight compartment, the condensing fluid and the boiling fluid mixture being immiscible, and the condensing fluid comprising a lower specific gravity than that of the boiling fluid mixture, and a higher thermal conductivity than that of the boiling fluid mixture, wherein the condensing fluid facilitates condensing of vaporized boiling fluid mixture within the fluid-tight compartment; and providing a cooling structure disposed within the fluid-tight compartment, the cooling structure comprising a condensing region and a sub-cooling region, the condensing region being in contact with the condensing fluid, and the sub-cooling region being in contact with the boiling fluid mixture, wherein the cooling structure facilitates heat removal from the fluid-tight compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
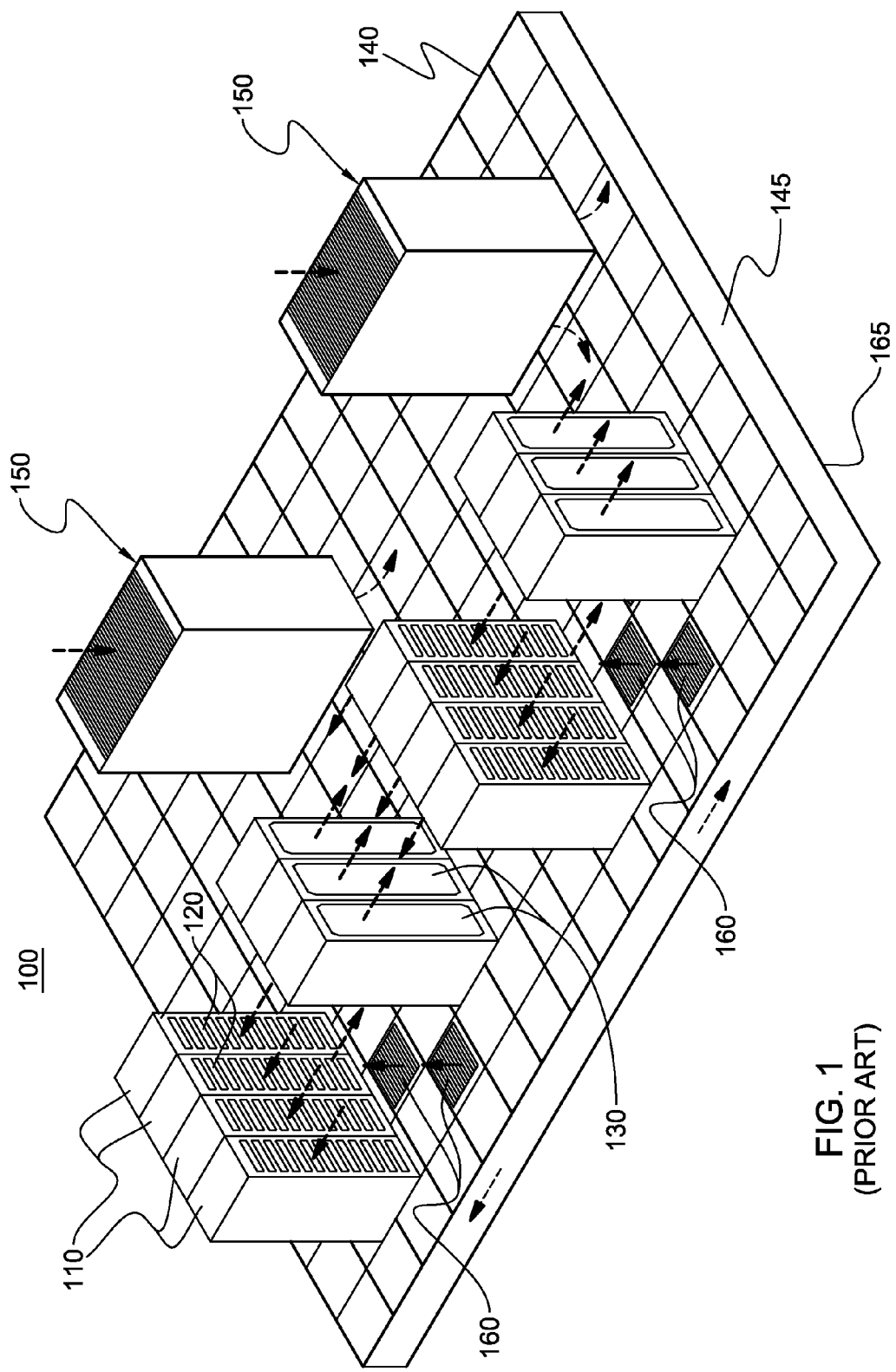
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise one or more electronic subsystems. "Electronic subsystem" refers to any sub-housing, blade, book, drawer, node, compartment, board, etc., having one or more heat-generating electronic components disposed therein or thereon. An electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, an "air-to-liquid heat exchanger" means any heat exchange mechanism characterized as described herein, across which air passes and through which liquid coolant can circulate; and includes, one or more discrete air-to-liquid heat exchangers, coupled either in series or in parallel. An air-to-liquid heat exchanger may comprise, for example, one or more coolant flow paths, formed of thermally conductive tubing (such as copper or other tubing) thermally coupled to a plurality of fins across which air passes. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
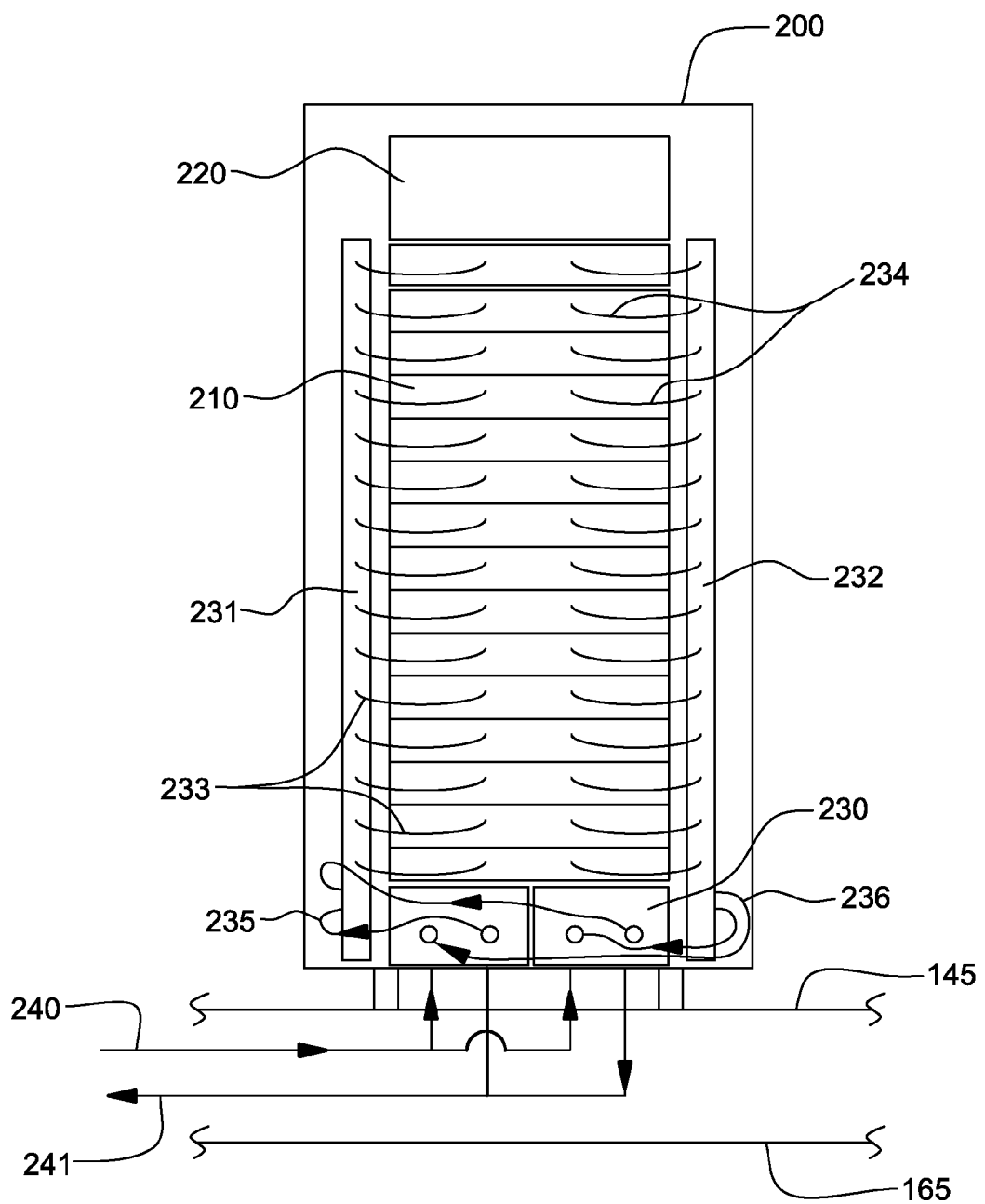
FIG. 2 is a front elevational view of one embodiment of a liquid-cooled electronics rack comprising multiple electronic subsystems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic subsystems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic subsystems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-7A & 7D-9) disposed within the subsystems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic subsystems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
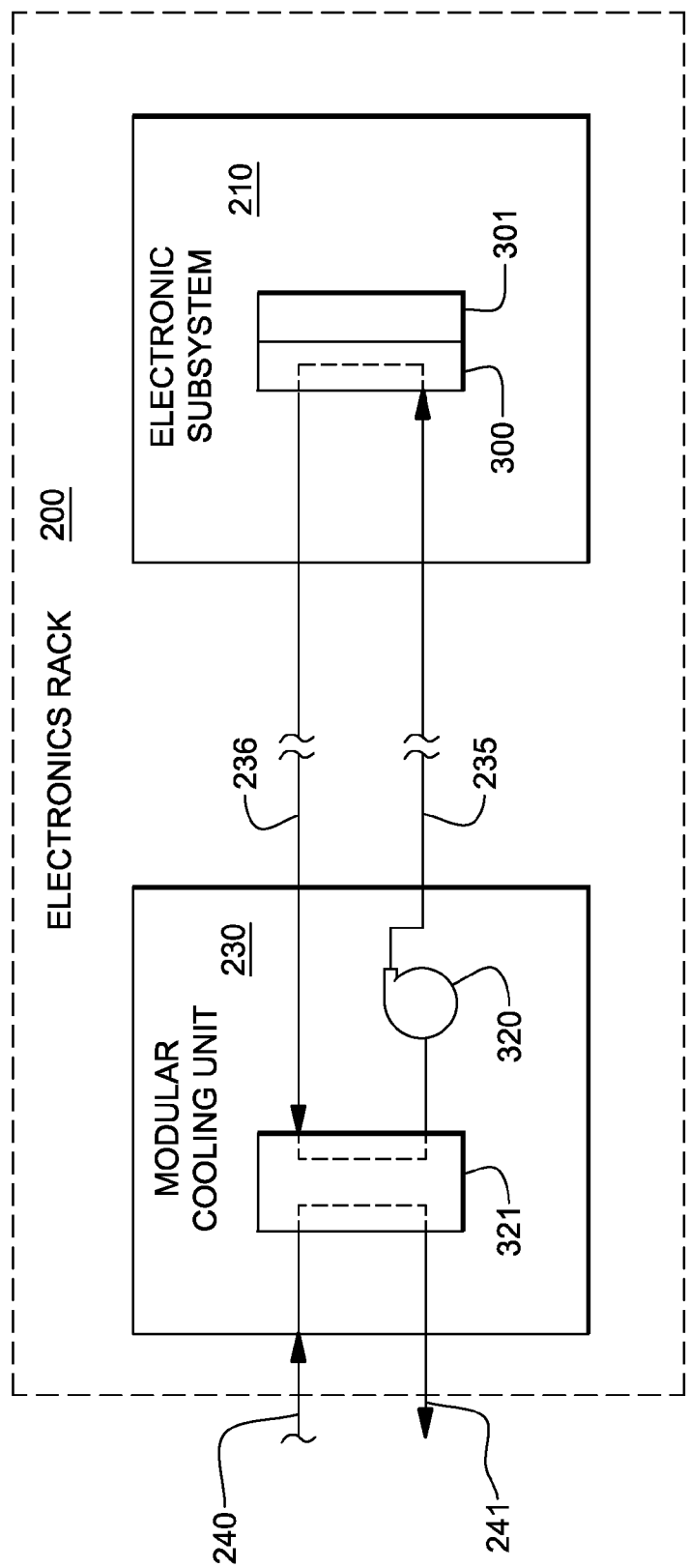
FIG. 3 is a schematic of an electronic subsystem of an electronics rack and one approach to liquid-cooling of an electronic component with the electronic subsystem, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic subsystem 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred.

Figure 4:
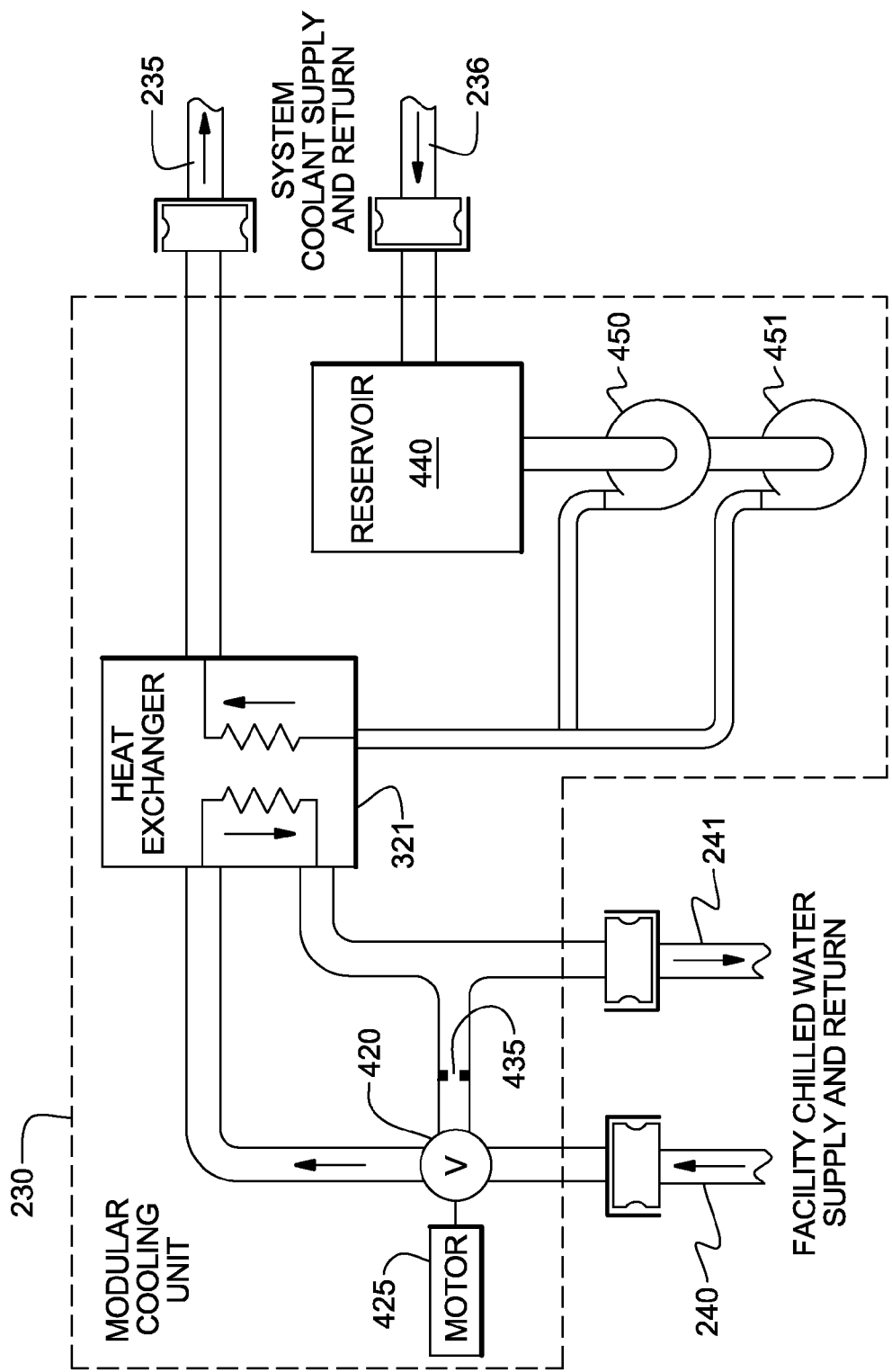
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
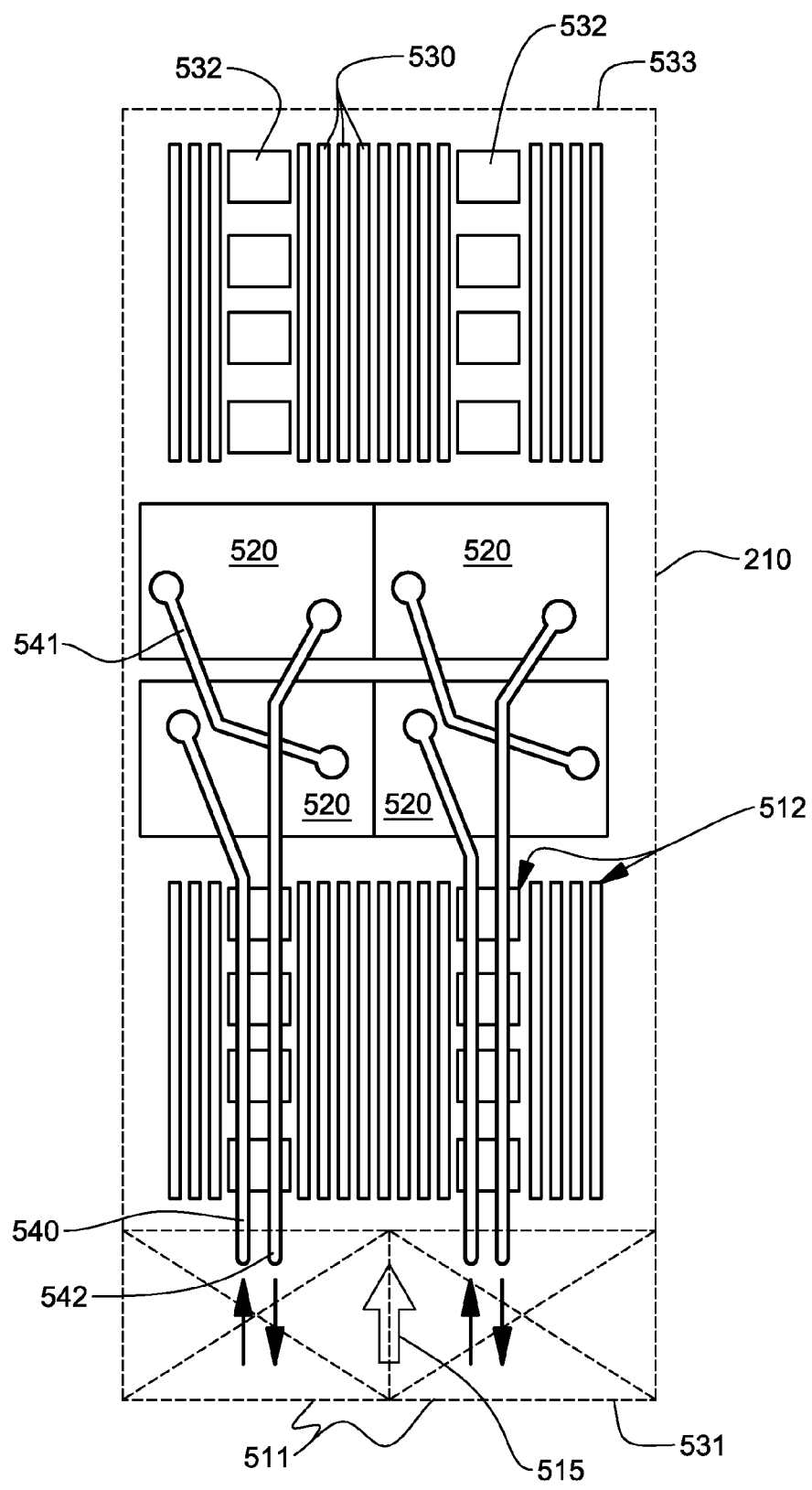
FIG. 5 is a plan view of one embodiment of an electronic subsystem layout illustrating an air and liquid-cooling approach for cooling electronic components of the electronic subsystem, in accordance with one or more aspects of the present invention.

FIG. 5 depicts another cooling approach, illustrating one embodiment of an electronic subsystem 210 component layout wherein one or more air moving devices 511 provide forced air flow 515 in normal operating mode to cool multiple electronic components 512 within electronic subsystem 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic subsystem 210, and partially arrayed near back 533 of electronic subsystem 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic subsystem using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, all components to be cooled are immersed in a dielectric fluid that dissipates heat through boiling. The vapor is then condensed by a secondary, rack-level working fluid using node or module-level, finned condensers, as explained below.

Direct immersion-cooling of electronic components of an electronic subsystem of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic subsystems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
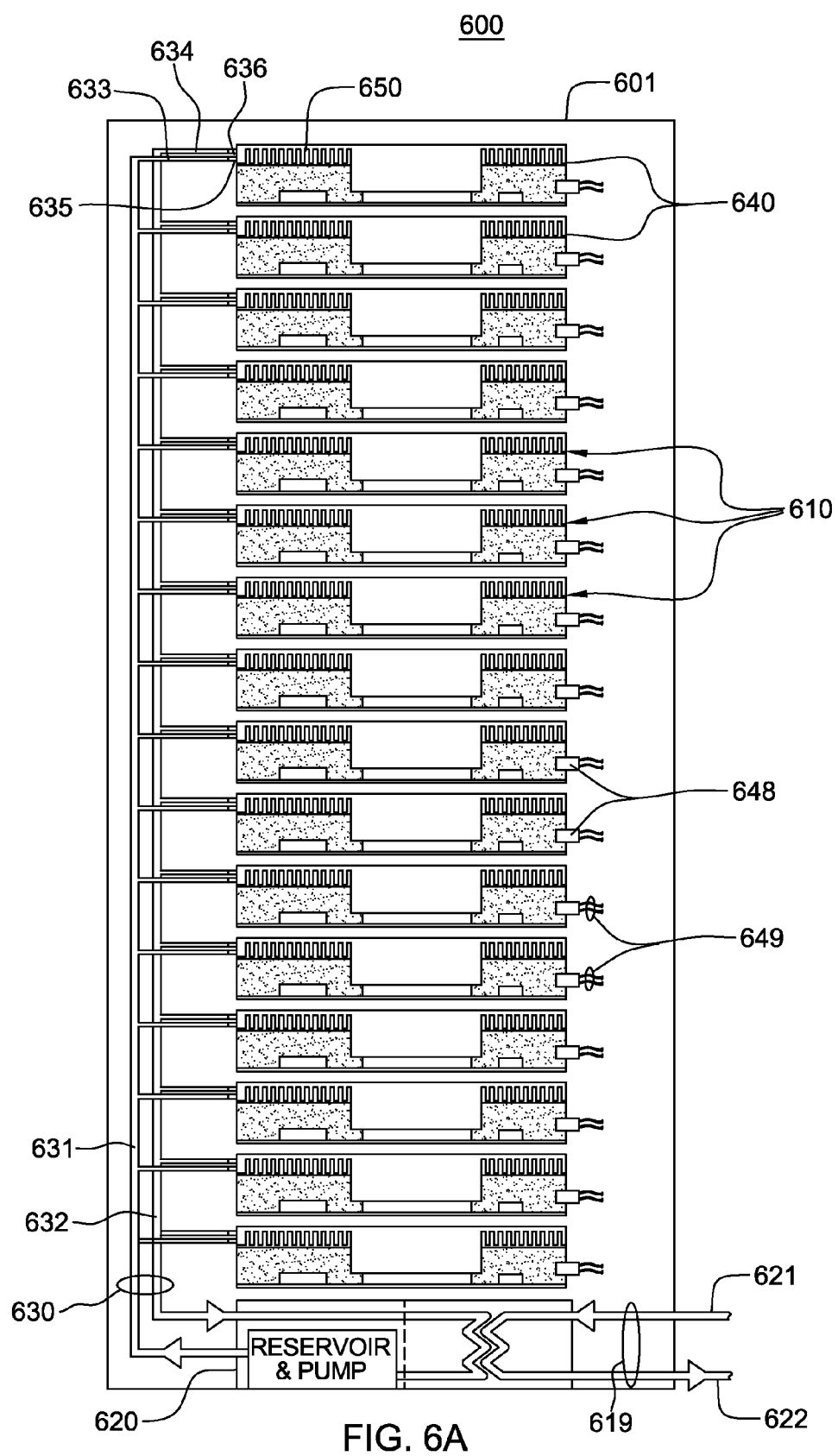
FIG. 6A is an elevational view of an alternate embodiment of a liquid-cooled electronics rack with immersion-cooling of electronic subsystems thereof, in accordance with one or more aspects of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may be a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic subsystem 610 via the respective liquid-cooled vapor condenser 650 is transferred from the system coolant via the coolant outlet manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing and the sealed housing is operatively positioned within the electronics rack.

Figure 6B:
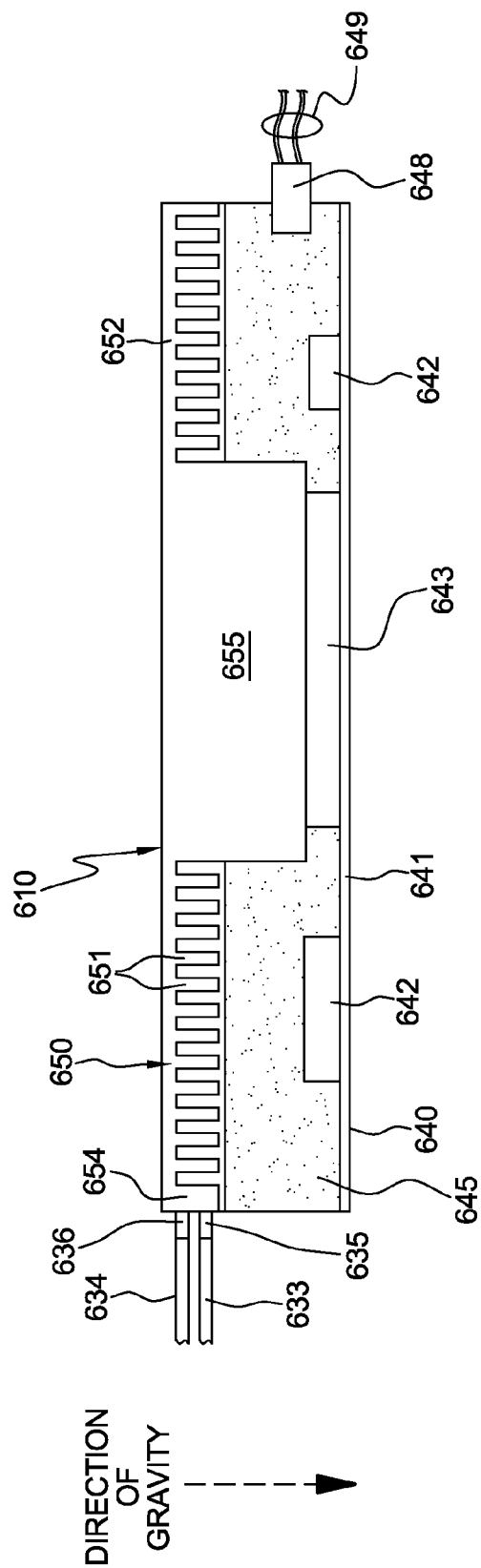
FIG. 6B is a cross-sectional elevational view of one immersion-cooled electronic subsystem of the liquid-cooled electronics rack of FIG. 6A, in accordance with one or more aspects of the present invention.

As illustrated in FIG. 6B, electronic subsystem 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic subsystem with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651, 655 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cool condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Two-phase immersion-cooling of one or more electronic components can be limited by saturation temperatures and performance of the vapor-condenser. For example, electronic-compatible fluids (e.g., dielectric fluids, such as fluorocarbons (FC) (such as FC-86, FC-87, FC-72) or segregated hydrofluoroether liquids (such as HFE-7000, HFE-7100, or HFE-7200), available from 3M Corporation, St. Paul Minn., U.S.A.) usable in immersion-cooling applications have specific boiling points based upon their chemistry. These boiling points are not always suitable for electronic cooling applications, and may need to be modified by pressurizing the immersion-cooling enclosure to alter the saturation pressure, and thus boiling temperature. A need to fine-tune the saturation pressure leads to additional manufacturing steps and components, and increased reliability issues. Current immersion-cooling technology is also limited by the rate of condensation of the vapor. Poor condensation leads to an increase in pressure within the immersion-cooling enclosure and potentially (detrimentally) raising the saturation temperature.

Disclosed hereinbelow are various cooling apparatuses which facilitate, in part, fine-tuning of the boiling point of the boiling fluid, and improved condensation of vaporized boiling fluid using a mixture of fluids within the immersion-cooling enclosure. Generally stated, provided herein are various embodiments of cooling apparatuses and methods of fabrication, which include a housing at least partially surrounding and forming a fluid-tight compartment about at least one electronic component to be cooled, and a boiling fluid mixture comprising a first dielectric fluid and a second dielectric fluid disposed within the fluid-tight compartment. The at least one electronic component to be cooled is immersed within the boiling fluid mixture. The cooling apparatus further includes a condensing fluid and a cooling structure. The condensing fluid is disposed within the fluid-tight compartment, and the condensing fluid and the boiling fluid mixture are immiscible. The condensing fluid, which has a lower specific gravity than that of the boiling fluid mixture, and a higher thermal conductivity than that of the boiling fluid mixture, facilitates condensing of vaporized boiling fluid mixture within the fluid-tight compartment. The cooling structure is also disposed within the fluid-tight compartment, and includes a condensing region and a sub-cooling region. The condensing region is in contact with the condensing fluid, and the sub-cooling region is in contact with the boiling fluid mixture. In operation, the cooling structure facilitates heat removal from the fluid-tight compartment.

More particularly, in operation, as the electronic component(s) to be cooled dissipates heat within the immersion-cooling enclosure, the component(s) causes the dielectric fluid mixture, made up of two or more miscible fluids, to boil at a specified (or set) mixture saturation temperature. The vapor produced rises first through the boiling fluid mixture, and then through the condensing fluid within the fluid-tight compartment. The condensing fluid acts as an internal condenser fluid to cool the vapor before the vaporized mixture reaches the cooling structure, which comprises, for example, a vapor-condenser with a plurality of thermally conductive fins. The cooling structure can be cooled by, for example, an externally-pumped liquid passing through the cooling structure, or by an external air stream. The internal condensing fluid is less dense than the boiling fluid mixture, and is immiscible with the boiling fluid mixture, such that it remains on top of the fluid-tight compartment in contact with a condensing region of the cooling structure. This intimate contact causes the condensing fluid to be cooler than the vaporized boiling fluid. Vapor rising through this condensing fluid layer thus partially condenses before reaching the cooling structure, thereby enhancing the condensation rate of the vapor. The immiscible condensing fluid also provides enhanced conductive and free convective heat transfer paths from the components to the cooling structure. Once the vaporized boiling fluid condenses, it falls back into the liquid boiling fluid mixture.

Figure 7:
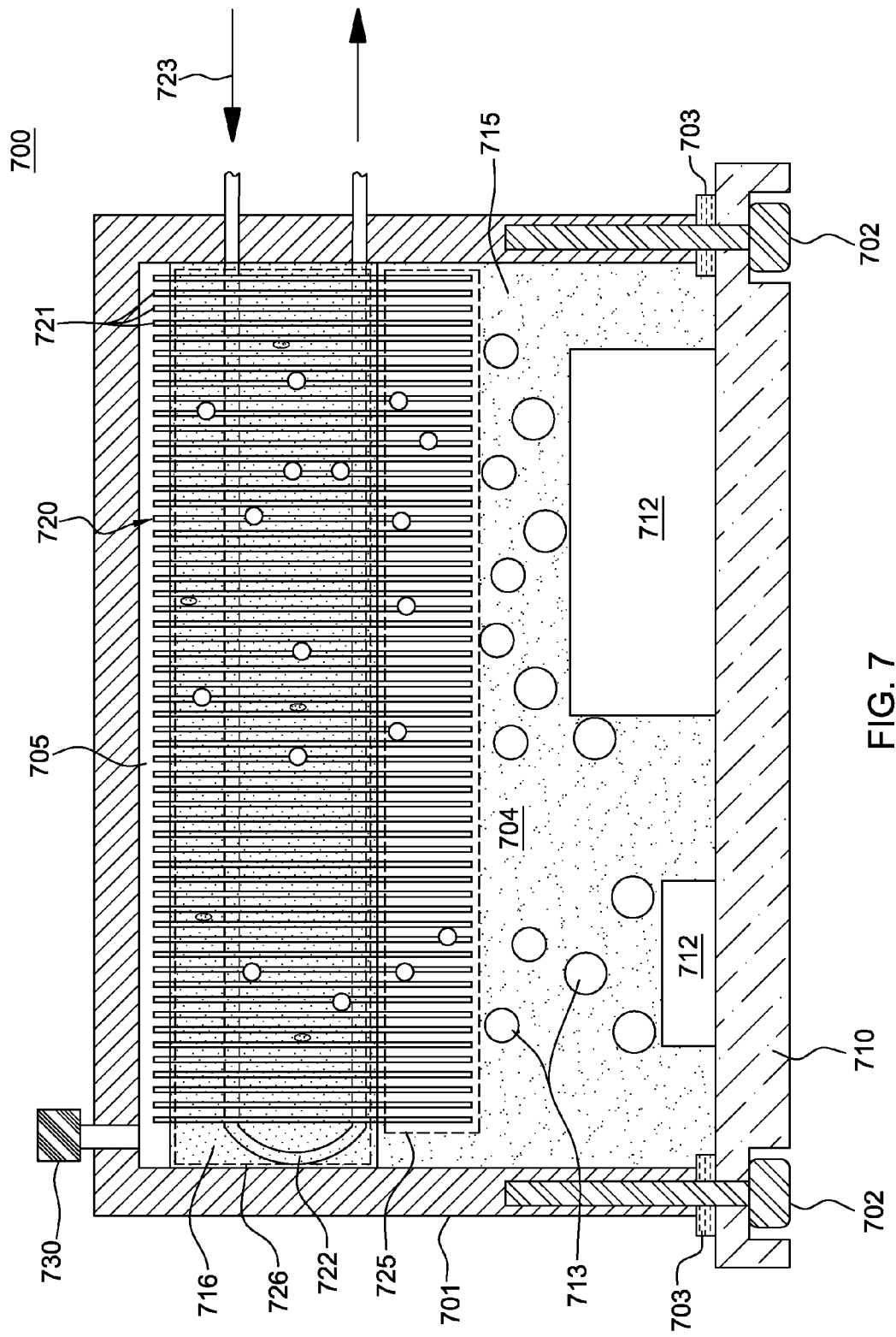
FIG. 7 is a cross-sectional elevational view of an alternate embodiment of an immersion-cooled electronic subsystem (or module) of, for example, a liquid-cooled electronics rack such as depicted in FIG. 6A, in accordance with one or more aspects of the present invention.

FIG. 7 is a cross-sectional elevational view of one embodiment of a cooling apparatus, generally denoted 700, in accordance with one or more aspects of the present invention. In one embodiment, cooling apparatus 700 may be configured to accommodate an electronic subsystem (or node) of an electronics rack, such as described above in connection with FIGS. 6A & 6B. In such an embodiment, a rack-level inlet manifold and rack-level outlet manifold would facilitate distribution of liquid coolant 723 among the cooling structures 720 associated with the electronic subsystems of the electronics rack. Further, depending upon the implementation, there may be a single cooling apparatus 700 within an electronic subsystem cooling, for example, substantially the entire electronic subsystem, or multiple such cooling apparatuses within the electronic subsystem, for example, to separately cool multiple high-heat-generating electronic components thereof.

In the embodiment of FIG. 7, cooling apparatus 700 includes cooling structure 720, which functions as a heat exchanger, and comprises one or more coolant-carrying channels 722 through which liquid coolant 723 flows to facilitate extraction of heat from the enclosure via a plurality of thermally conductive fins 721 of the cooling structure 720. Cooling apparatus 700 further includes a housing or immersion-cooling enclosure 701 at least partially surrounding one or more electronic components 712, which in this example, are mounted to a substrate 710, such as a printed circuit board, to which immersion-cooling enclosure 701 is attached via, for example, attachment mechanisms 702 (e.g., screws) and gasket seals 703. Within immersion-cooling enclosure 701, a fluid-tight compartment 704 is defined which includes (in one embodiment), a boiling fluid mixture 715 that partially fills fluid-tight compartment 704. Also disposed within fluid-tight compartment 704 is a condensing fluid 716. As illustrated, the cooling structure comprises a condensing region 726 residing within condensing fluid 716, as well as a sub-cooling region 725 residing within boiling fluid mixture 715. In one embodiment, the condensing fluid has a lower specific gravity than that of the boiling fluid mixture, and a higher thermal conductivity than that of the boiling fluid mixture, such that the condensing fluid 716 resides above the boiling fluid mixture and is more thermally conductive.

As noted, cooling structure 720 includes (in this embodiment) a plurality of thermally conductive fins 721, which may be disposed substantially parallel to each other and through which (in one embodiment) the one or more coolant-carrying channels 722 pass. Note that in the embodiment of FIG. 7, multiple differently-sized electronic components 712 are illustrated by way of example only. The electronic components 712 to be cooled may comprise the same or different types of electronic components, and as one example, the immersion-cooling enclosure 701 may accommodate an entire electronic subsystem (or node) of an electronics rack, such as described above in connection with FIGS. 6A & 6B. A sealable fill port 730 may be provided in immersion-cooling enclosure 701 to facilitate immersing the one or more electronic components 712 within the boiling fluid mixture and adding the condensing fluid within the compartment.

The boiling fluid mixture may comprise a mixture of any electronic-compatible evaporator fluids, herein referred to as comprising a first dielectric fluid and a second dielectric fluid. By providing a mixture of two or more dielectric fluids, the boiling point of the mixture can be tailored, for example, through testing, to achieve a desired boiling point within the immersion-cooling enclosure. By way of example, two compatible, chemically non-reactive and miscible evaporator fluids with different boiling points at a given saturation pressure can be mixed to produce a mixture with an intermediate boiling point (or boiling range) at the same saturation pressure. For example, Novec™ HFE-7000, offered by 3M Corporation, of St. Paul, Minn., U.S.A., has a boiling point of 34° C., and Novec™ HFE-7100 (also offered by 3M Corporation), has a boiling point of 61° C. These fluids are miscible and can be mixed to obtain a mixture with a boiling point somewhere between 34° C. and 61° C. The exact boiling point (or range) of the mixture is dependent on the chemistry and fractions of the fluids, and can be empirically determined by varying the fraction of one fluid in the mixture and measuring the mixture's boiling point.

Note that in the embodiment of FIG. 7, substrate 710 is shown to be horizontal by way of example only, as explained further below. In this embodiment, the subsystem (or module) is immersion-cooled by first filling fluid-tight compartment 704 with a degassed mixture 715 of two completely miscible evaporator fluids, that is, the first dielectric fluid and the second dielectric fluid, which have different boiling points. The ratio of the mixture is dependent on the desired properties of the resulting mixture, and in particular, the mixture's desired boiling point, as described above. The fluids employed in the mixture are dielectric in nature to facilitate direct contact of the mixture with the one or more electronic components to be cooled. The condensing fluid is then degassed and fed into the fluid-tight compartment using the fill port. This third fluid is immiscible with the boiling fluid mixture, is less dense than the boiling fluid mixture, and has a higher boiling point. The condensing fluid also preferably possess high thermal conductivity. Examples of condensing fluids are DI water, and thermally conductive nanofluids. This third fluid is filled until a small amount of expansion space 705 remains within the fluid-tight compartment.

Figure 8A:
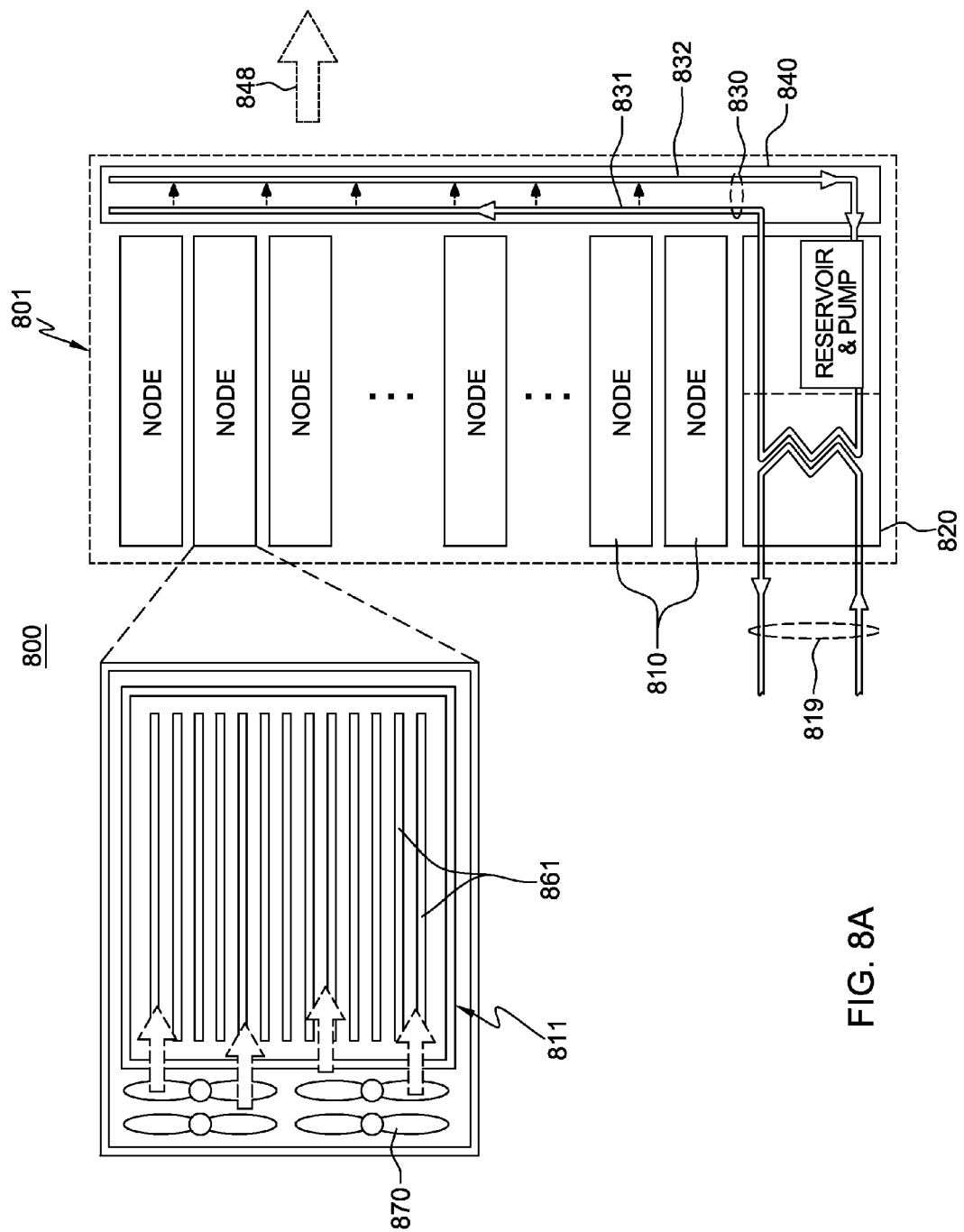
FIG. 8A is a schematic of one embodiment of a partially air-cooled electronics rack with immersion-cooling of one or more electronic components or subsystems thereof, in accordance with one or more aspects of the present invention.
Figure 8B:
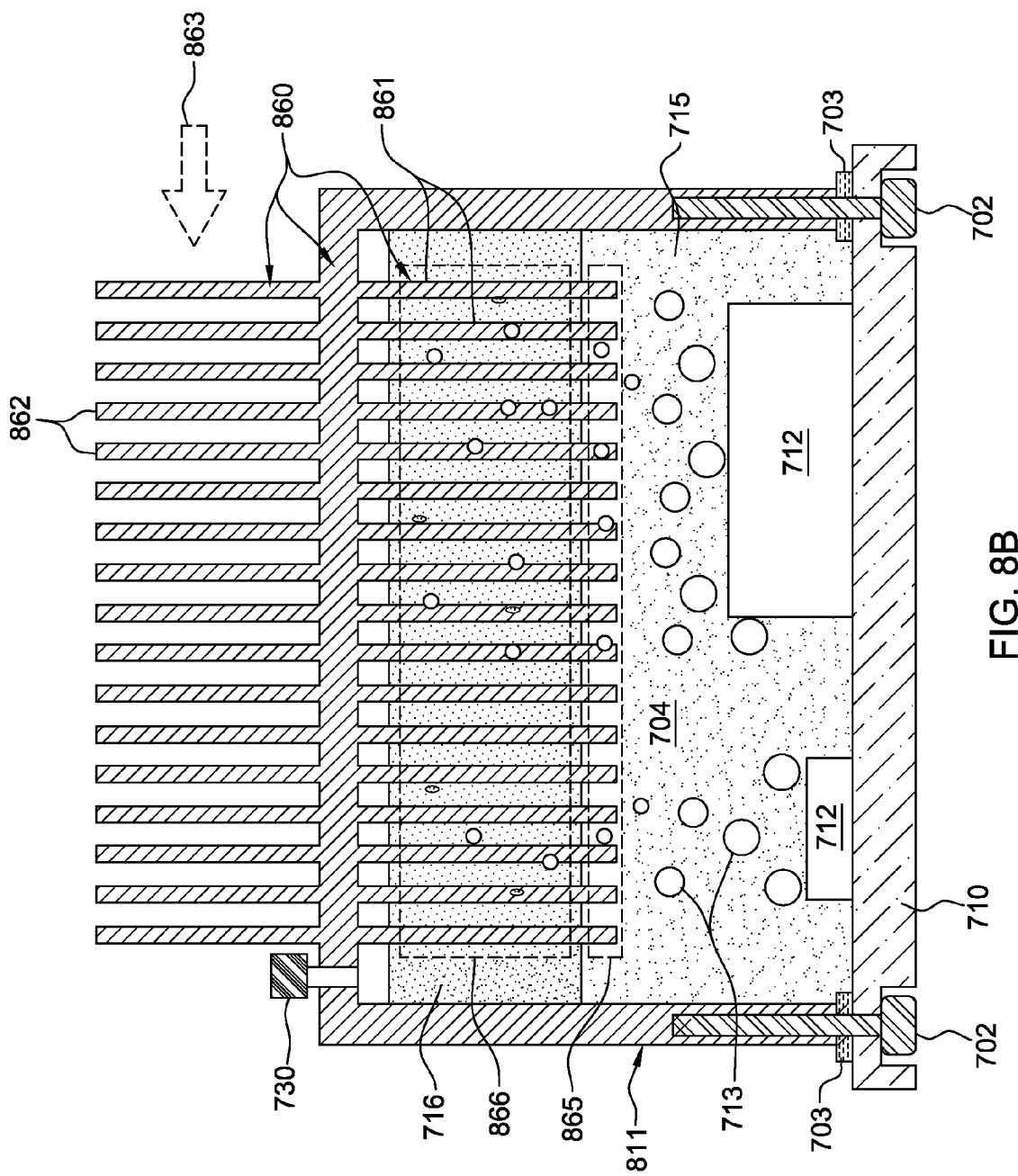
FIG. 8B is a cross-sectional elevational view of one embodiment of an immersion-cooled electronic subsystem (or module) employing an air-cooled cooling structure, in accordance with one or more aspects of the present invention.
Figure 8C:
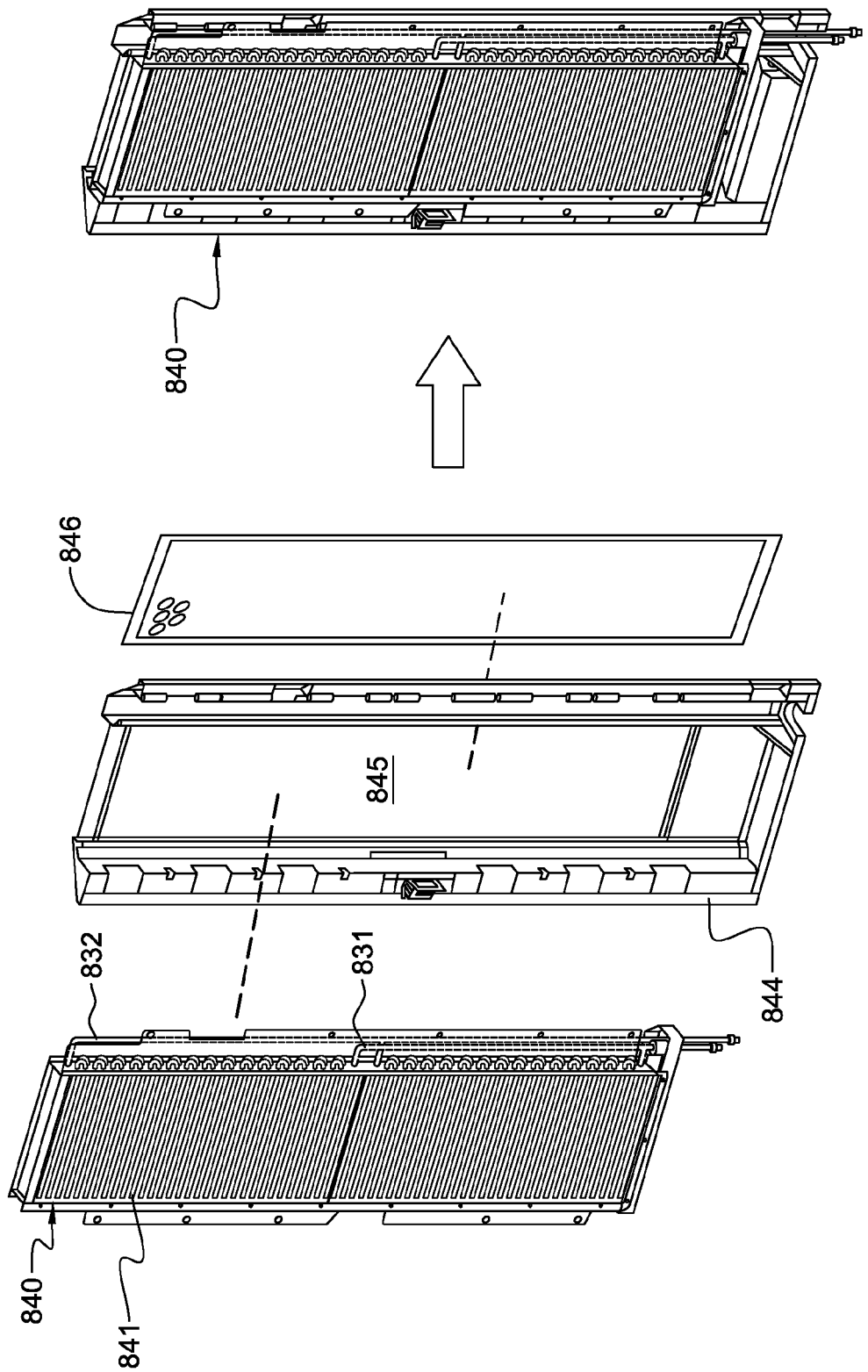
FIG. 8C is a partially exploded view of one embodiment of an air-to-liquid heat exchanger mounted in a rack door, which includes a heat exchanger coil and inlet and outlet plenums of a heat exchange system for use in an electronics rack such as depicted in FIG. 8A, in accordance with one or more aspects of the present invention.

When the electronic components are in operation, heat generated by the components 712 causes the boiling fluid mixture 715 to boil at the desired boiling point. The vaporized 713 fluid mixture rises through the boiling fluid mixture 715 and enters the condensing fluid 716, which being less dense, resides above the boiling fluid mixture 715. The thermally conductive condensing fluid is in direct contact with the cooling structure 720, e.g., thermally conductive fins 721 of a vapor condenser, and thus tends to be (on average) cooler than the boiling fluid mixture. The rising vapor 713 begins to condense by contact with the condensing fluid 716, such that it partially condenses before reaching the cooling structure. The remaining vapor then condenses on the cooling structure (e.g., thermally conductive fins), and drips back down into the boiling fluid mixture 715. In the embodiment of FIG. 7, the cooling structure is a liquid-cooled structure using an external coolant (such as water). FIGS. 8A-8C depict a variation on this cooling apparatus.

FIG. 8A is a schematic of another embodiment of an electronic system 800 comprising a liquid-cooled electronics rack 801 with a plurality of immersion-cooled electronic subsystems 810 disposed, in the illustrated embodiment, horizontally, so as to be stacked within the rack. By way of example, each electronic subsystem 810 may be a server unit of a rack-mounted plurality of server units. In addition, each electronic subsystem may include multiple electronic components to be cooled, which in one embodiment, comprise multiple different types of electronic components having different heights and/or shapes within the electronic subsystem.

The cooling apparatus is shown to include one or more modular cooling units (MCUs) 820 disposed, by way of example, in a lower portion of electronics rack 801. Each modular cooling unit 820 may be similar to the modular cooling unit depicted in FIG. 4, and described above. The modular cooling unit 820 includes, for example, a liquid-to-liquid heat exchanger for extracting heat from coolant flowing through a system coolant loop 830 of the cooling apparatus and dissipating heat within a facility coolant loop 819, comprising a facility coolant supply line and a facility coolant return line. As one example, the facility coolant supply and return lines couple modular cooling unit 820 to a data center facility cooling supply and return (not shown). Modular cooling unit 820 further includes an appropriately-sized reservoir, pump, and optional filter, for moving liquid-coolant under pressure through system coolant loop 830. In one embodiment, system coolant loop 830 includes a coolant supply manifold 831 and a coolant return manifold 832, which facilitate flow of system coolant through, for example, an air-to-liquid heat exchanger 840 mounted to an air outlet side (or an air inlet side) of electronics rack 801. By way of example, one embodiment of an air-to-liquid heat exchanger 840 is described further below with reference to FIG. 8C.

Referring collectively to FIGS. 8A & 8B, one or more of the electronic components 712 within one or more of the electronic subsystems 810 is immersion-cooled, for example, as explained above in connection with FIG. 7. In this embodiment, however, the cooling structure 860 is an air-cooled structure comprising a plurality of air-cooled fins 862 extending from cooling structure 860 in a direction opposite to the plurality of thermally conductive condenser fins 861 of cooling structure 860 disposed in compartment 704. Air 863 passes across air-cooled fins 862, transporting heat from cooling structure 860 outwards from electronics rack 801 and, in the depicted embodiment of FIG. 8A, across air-to-liquid heat exchanger 840. Air-to-liquid heat exchanger 840 extracts heat from the egressing rack-level airflow 848 before it passes into the data center. One or more air-moving devices (such as fans or blowers) 870 may be associated with the electronic subsystem(s) 810 comprising the immersion-cooling enclosure(s) 811 surrounding the one or more heat-generating electronic components 712 to be cooled. Note that the use of air-to-liquid heat exchanger 840 at the air outlet side of electronics rack 801 is an optional enhancement. Alternatively, the heated air exhausting from electronics rack 801 could exhaust directly into the data center and be cooled by one or more computer room air-conditioning units, such as described above in connection with FIG. 1.

Similar to the cooling apparatus 700 described above in connection with FIG. 7, cooling apparatus 800 includes immersion-cooling enclosure 811 at least partially surrounding the one or more electronic components 712, which are mounted, for example, to substrate 710, to which immersion-cooling enclosure 811 is attached via, for example, attachment mechanisms 702 (e.g., screws) and gasket seals 703. Within immersion-cooling enclosure 811, a fluid-tight compartment is defined which includes (in one embodiment) a boiling fluid mixture 715 that partially fills the fluid-tight compartment, and a condensing fluid 716. As illustrated, cooling structure 860 comprises a condensing region 866 residing within condensing fluid 716, and a sub-cooling region 865 residing within boiling fluid mixture 715. In one embodiment, condensing fluid 716 has a lower specific gravity than that of the boiling fluid mixture, and a higher thermal conductivity than that of the boiling fluid mixture, as described above. Operation of the cooling apparatus is similar to that described above in connection with FIG. 7, but rather than rejecting transferred heat to a liquid-coolant flowing through the cooling structure, heat is rejected to air 863 passing across air-cooled fins 862 and egressing, in one example, through the air outlet side of electronics rack 801 for passage across air-to-liquid heat exchanger 840.

FIG. 8C depicts additional details of one embodiment of an air-to-liquid heat exchanger mounted in a rack door, in accordance with one or more aspects of the invention disclosed herein. As shown at the left portion of the figure, heat exchanger 840 includes one or more tube sections 841, which in one embodiment, may have a plurality of fins projecting therefrom. Depending upon the implementation, tube sections 841 may comprise a single, serpentine channel, or a plurality of discrete heat exchange tube sections coupled together via inlet and outlet plenums 831, 832 disposed at the edge of the rack door configured to hingedly mount to the electronics rack. As shown, the one or more heat exchange tube sections are sized to substantially cover the entire opening 845 in the frame 844 of the door.

In the depicted embodiment, the heat exchange tube sections are fed coolant by coolant inlet plenum 831 and exhaust coolant via coolant outlet plenum 832. Flexible hoses (not shown) may be employed for connecting to hard plumbing disposed near the electronics rack. These hoses would be brought into air-to-liquid heat exchanger 840 adjacent to the hinge axis of the door.

FIG. 8C also illustrates one embodiment of an optional perforated planar surface 846 is illustrated. First and second such perforated planar surfaces 846 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 8C. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section may comprise at least one of a continuous tube or multiple tubes connected together to form one continuous serpentine cooling channel. In the embodiment shown, each heat exchange tube section is a continuous tube having a first diameter, and each plenum 831, 832, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 8C, the heat exchange tube sections further include a plurality of fins extending from tube(s) 841 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing.

FIGS. 9A-9D depict additional alternate embodiments of a cooling apparatus, in accordance with one or more aspects of the present invention. In these embodiments, the cooling apparatus is substantially identical, with the exception of the cooling structure of the cooling apparatus, as described hereinbelow. Further, operation of the cooling apparatuses of FIGS. 9A-9D is similar to that described above in connection with FIGS. 7 & 8B.

Figure 9A:
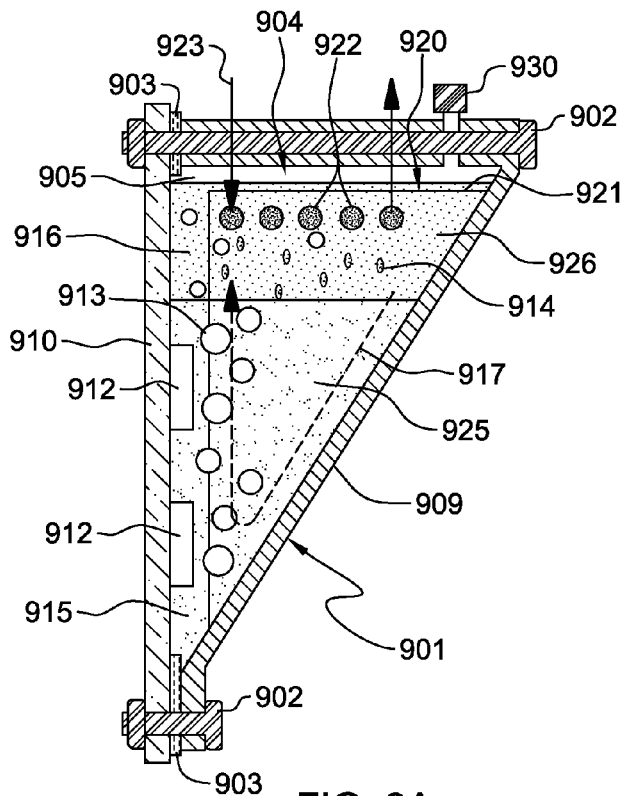
FIG. 9A is a cross-sectional elevational view of an alternate embodiment of an immersion-cooled electronic subsystem (or module), in accordance with one or more aspects of the present invention.

Referring first to FIG. 9A, a cooled electronic system is depicted comprising a cooling apparatus, in accordance with one or more aspects of the present invention. In this embodiment, the cooling apparatus includes a housing (or enclosure) 901 at least partially surrounding and forming a fluid-tight compartment 904 about one or more electronic components 912 to be cooled. As illustrated, electronic components 912 are disposed on a substrate 910 oriented vertically, and housing 901 comprises a sloped side wall 909 opposite to substrate 910. Sloped side wall 909 slopes outward from a lower region to an upper region of fluid-tight compartment 904. Depending on the implementation, there may be a single cooling apparatus within an electronic subsystem cooling, for example, substantially the entire electronic subsystem, or multiple such cooling apparatuses within the electronic subsystem, for example, to separately cool multiple high-heat-generating electronic components thereof. As explained above in connection with FIGS. 6A & 6B, a rack-level inlet manifold and rack-level outlet manifold may be provided to facilitate distribution of a liquid coolant 923 among the cooling structures 920 associated with the electronic subsystems of an electronics rack, in one implementation.

In the embodiment illustrated, cooling structure 920 functions as a heat exchanger, and comprises one or more coolant-carrying channels 922 through which liquid coolant 923 flows to facilitate extraction of heat from the enclosure via a plurality of thermally conductive fins 921 of cooling structure 920. In the embodiment illustrated, the plurality of thermally conductive fins extend from sloped side wall 909 of housing 901 into fluid-tight compartment 904, and in one embodiment, are each triangular-shaped in elevational view, as illustrated in FIG. 9A. As further illustrated in FIG. 9A, immersion-cooling enclosure 901 is attached via, for example, attachment mechanisms 902 (e.g., screws) and gasket seals 903 to vertically-oriented substrate 910. Within immersion-cooling enclosure 901, fluid-tight compartment 904 includes (in one embodiment) a boiling fluid mixture 915 that partially fills fluid-tight compartment 904, and a condensing fluid 916. As illustrated, the cooling structure comprises a condensing region 926 residing within condensing fluid 916, and a sub-cooling region 925 residing within boiling fluid mixture 915. In one embodiment, the condensing fluid 916 has a lower specific gravity than that of the boiling fluid mixture 915, and a higher thermal conductivity than the boiling fluid mixture, such that the condensing fluid 916 resides above the boiling fluid mixture 915, as illustrated in FIG. 9A.

The plurality of thermally conductive fins 921 of cooling structure 920 may be disposed substantially parallel to each other, and in the embodiment of FIG. 9A, the one or more coolant-carrying channels 922 pass through and are in thermal contact with the plurality of thermally conductive fins 921, for example, in the condenser region 926 thereof. Note that in the embodiment of FIG. 9A, multiple electronic components 912 are illustrated by way of example only. The electronic components 912 to be cooled may comprise the same or different types of electronic components, and as one example, the immersion-cooling enclosure 901 may accommodate an entire electronic subsystem (or node) of an electronics rack, such as described above in connection with FIGS. 6A & 6B. A sealable fill port 930 may be provided in immersion-cooling enclosure 901 to facilitate immersing the one or more electronic components 912 within the boiling fluid mixture 915.

As with the examples described above in connection with FIGS. 7 & 8B, boiling fluid mixture 915 comprises a mixture of any electronic-compatible evaporator fluids, referred to herein as including a first dielectric fluid and a second dielectric fluid. By providing a mixture of two or more dielectric fluids, the boiling point of the mixture can be tailored, for example, through experimentation, to achieve a desired boiling point within the immersion-cooling enclosure. By way of example, two compatible, chemically non-reactive and miscible evaporator fluids with different boiling points at a given saturation pressure can be mixed to produce a mixture with an intermediate boiling point (or boiling range) at the same saturation pressure. By way of example, reference the above-noted Novec™ dielectric fluids example (i.e., HFE-7000 and HFE-7100), which may be mixed to obtain a mixture with a boiling point somewhere between 34° C. and 61° C. The exact boiling point (or range) of the mixture is dependent upon the chemistry and fractions of the fluids, and can be empirically determined by varying the fraction of one fluid in the mixture and measuring the mixture's boiling point.

In the embodiment of FIG. 9A, the electronic component(s) is immersion-cooled by first filling fluid-tight compartment 904 with a degassed mixture of two or more completely miscible evaporator fluids, that is, the first dielectric fluid and the second dielectric fluid, which have different boiling points. The ratio of the mixture is dependent on the desired properties of the resulting mixture 915, and in particular, the mixture's desired boiling point, as described above. The fluids employed in the mixture are dielectric in nature to facilitate direct contact of the fluid with the one or more electronic components to be cooled. The condensing fluid is then degassed and fed into the fluid-tight compartment 904 using fill port 930. This third fluid is immiscible with the boiling fluid mixture 915, and is also less dense than the boiling fluid mixture, and has a higher boiling point. The condensing fluid also preferably possess high thermal conductivity. Examples of condensing fluids are DI water, and thermally conductive nanofluids. This third fluid is filled until a small amount of expansion space 905 remains within the fluid-tight compartment.

When the electronic components are in operation, heat generated by the components causes the boiling fluid mixture 915 to boil at the desired boiling point. The vaporized 913 fluid mixture rises through the boiling fluid mixture 915, and enters the condensing fluid 916, which being less dense, resides above the boiling fluid mixture 915. The thermally conductive condensing fluid 916 is in direct contact with the cooling structure 920, such as the thermally conductive fins 921 thereof, and tends to be (on average) cooler than the boiling fluid mixture 915. The rising fluid vapor 913 begins to condense by contact with the condensing fluid, shrinking the vapor bubbles such that it partially condenses before reaching the cooling structure. The remaining vapor then condenses 914 on the cooling structure, and drips back down into the boiling fluid mixture 915. In the embodiment of FIG. 9A, cooling structure 920 is a liquid-cooled structure using an external coolant 923 (such as water).

Note that in operation, agitation and natural convective cycle entrains a portion 917 of the less dense, cooler condensing fluid 916 into the boiling fluid mixture 915, which assists with contact condensation of vaporized 913 boiling fluid mixture within the heated volume. The vertical orientation of substrate 910 in combination with the sloped side wall 909 facilitate this natural convective cycle, and thus, the entraining of the less dense, cooler condensing fluid within the boiling fluid mixture. Due to the larger vertical dimension of the upper region of the fluid-tight compartment, natural convection plays a stronger role in the arrangement of FIG. 9A compared with, for example, the embodiments of FIGS. 7 & 8B. The circulation set up by the density gradient entrains the cooler condenser fluid into the boiling fluid mixture, and moves it closer to the heated electronic component(s) and the vapor-generation sites. The entrainment of this cooler condensing fluid facilitates condensation of the vaporized 913 boiling fluid mixture produced in the deeper regions of the enclosure. The rack-level configurations for a liquid-cooled cooling apparatus such as depicted in FIG. 9A may be similar to that described above in connection with FIG. 6A. Note also that the configuration of FIG. 9A could be beneficially employed with any vertically-arranged electronic subsystem (or node), such as the nodes or blades of a multi-blade center system, marketed by International Business Machines Corporation, of Armonk, N.Y., U.S.A. By way of example, a multi-blade center system may comprise a stand-alone server system, which incorporates scalable computing functionality up to, for example, 14 or more high-performance servers (or blades).

Figure 9B:
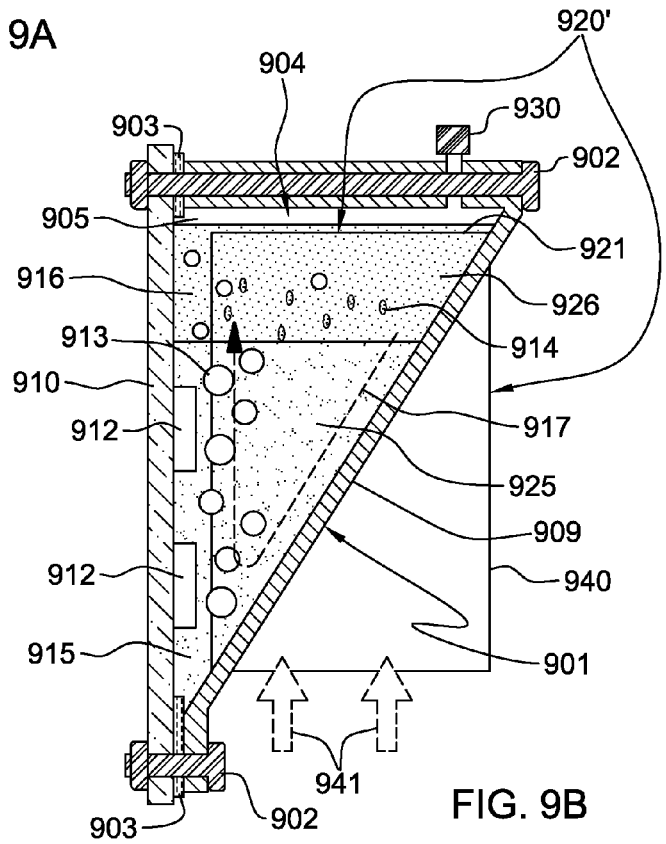
FIG. 9B is a cross-sectional elevational view of another embodiment of an immersion-cooled electronic subsystem (or module), in accordance with one or more aspects of the present invention.
Figure 9C:
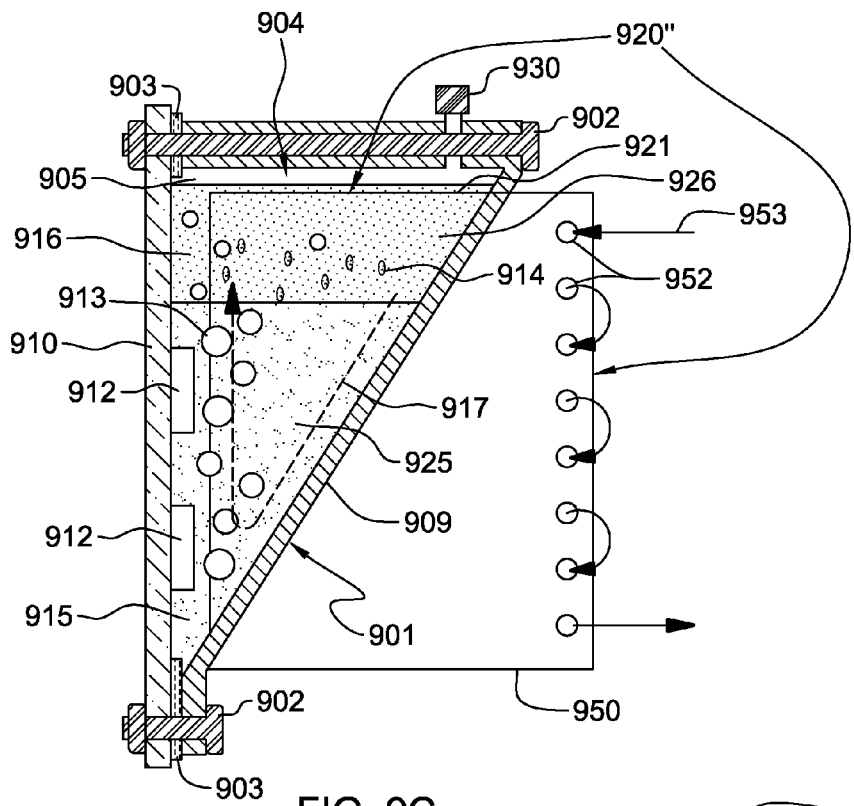
FIG. 9C is a cross-sectional elevational view of a further embodiment of an immersion-cooled electronic subsystem (or module), in accordance with one or more aspects of the present invention.
Figure 9D:
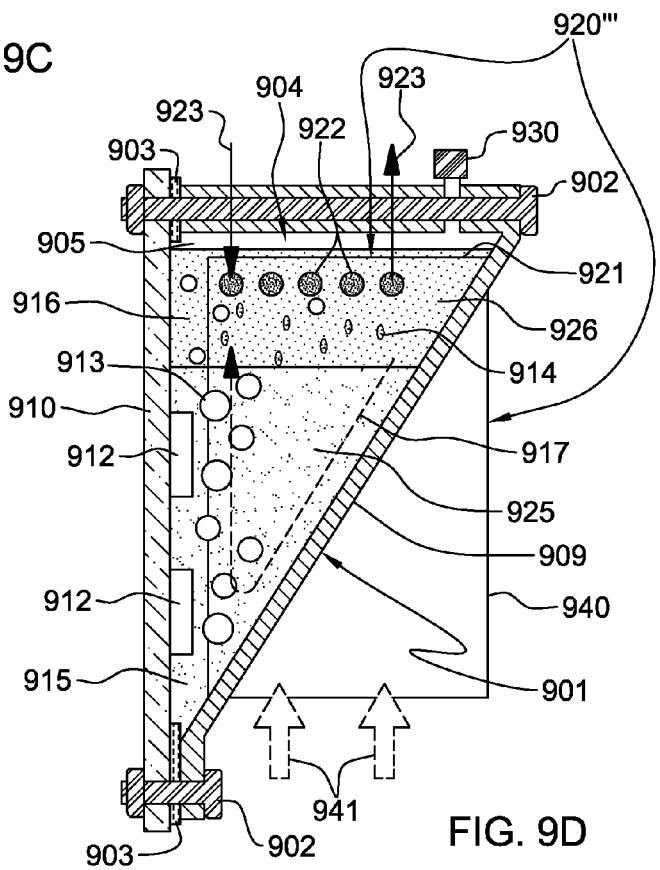
FIG. 9D is a cross-sectional elevational view of another embodiment of an immersion-cooled electronic subsystem (or module), in accordance with one or more aspects of the present invention.

FIGS. 9B-9D depict several variations on the cooling structure described above in connection with FIG. 9A. Unless otherwise noted, construction and operation of these cooling apparatus is similar to that described above in connection with FIG. 9A.

As illustrated in FIG. 9B, cooling structure 920' of the cooling apparatus functions as the heat sink, and comprises the plurality of thermally conductive fins 921 disposed within the fluid-tight compartment 904 of the immersion-cooling enclosure 901. In the embodiment illustrated, the plurality of thermally conductive fins 921 extend from sloped side wall 909 of the enclosure disposed opposite to the vertically-oriented substrate 910. The plurality of thermally conductive fins 921 of cooling structure 920' further include a condensing region 926 and a sub-cooling region 925 in respective contact with the condensing fluid 916 and boiling fluid mixture 915 within fluid-tight compartment 904. In this embodiment, cooling apparatus 920' further includes a plurality of air-cooled fins 940 extending external to enclosure 901, across which air 941, such as a chilled external airflow, passes. Air-cooled fins 940 are in thermal contact with the plurality of thermally conductive fins 921 extending from sloped side wall 909 of the enclosure, across sloped side wall 909, which is thermally conductive. As one fabrication example, a block of conductive material, such as metal, could be machined with appropriate fins 921 on one side and fins 940 on another side. In this embodiment, the thermally conductive fins 921 and air-cooled fins 940 are illustrated as triangular-shaped in elevational view, by way of example only.

FIG. 9C depicts a similar cooling apparatus to that described above in connection with FIG. 9B, with the exception that cooling apparatus 920" comprises the air-cooled fins 950 that are extended outward further from housing 901 of the cooling apparatus to facilitate coupling of one or more coolant-carrying channels 952 to the air-cooled fins 950. A tube and fin condenser configuration could be employed in this construction. The coolant-carrying channel(s) facilitates the passage of an external cooling liquid 953 (such as water) through the cooling structure 920". Note that the specific configuration of cooling structure employed within a given cooling structure may depend upon spatial constraints within the subsystem, blade, node, etc. of the associated electronics rack.

FIG. 9D depicts a further variation of a cooling structure 920''', which combines the cooling structures of FIGS. 9A & 9B, wherein the cooling structure 920''' comprises both one or more coolant-carrying channels 922 disposed within fluid-tight compartment 904, as well as a plurality of air-cooled fins 940 extending from the immersion-cooling enclosure 901, such that the structure is both liquid-cooled, for example, via a system coolant 923, as well as air-cooled, for example, via a chilled airflow 941 passing through the electronics rack and across the air-cooled fins 940 of the cooling structure.

Those skilled in the art will note from the above description that provided herein are various novel cooling apparatuses and methods for immersion-cooling one or more electronic components (or subsystems). In particular, a boiling fluid mixture of two or more miscible dielectric fluids and a condensing fluid immiscible with the boiling fluid mixture are provided within the sealed compartment of the immersion-cooling enclosure. The condensing fluid has a lower specific gravity than that of the boiling fluid mixture, and a higher thermal conductivity, and facilitates condensing of vaporized boiling fluid mixture within the fluid-tight compartment. A cooling structure is also disposed within the compartment which includes a condensing region and a sub-cooling region, with the condensing region being in contact with the condensing fluid, and the sub-cooling region being in contact with the boiling fluid mixture.

The cooling structures provided herein facilitate preserving the advantages of immersion-cooling over, for example, pumped, single-phase liquid-cooling, despite limitations on the total heat transfer on the condenser side of a heat sink. Advantages of immersion-cooling including an improved temperature uniformity across the components, a lower required flow rate of the secondary fluid, and the potential for warm water-cooling. The latter advantage would further improve energy efficiency, and enable the use of economizers.

In addition, the cooling structures provided herein allow for a boiling point of the evaporator fluid mixture to be set based on the ratio of two miscible evaporator fluids. This facilitates setting component temperatures in the enclosure during operation thereof.

Enhanced condensation of vapor due to contact with the thermally conductive, non-miscible condensing fluid is also provided. In addition, entrainment of cooler condensing fluid within the boiling fluid mixture during boiling facilitates improving condensation of vaporized boiling fluid mixture within the two-fluid boiling fluid mixture volume. This improved condensation enables the use of the cooling apparatus with higher-power dissipating components and systems. Further, there is enhanced heat removal due to the additional conductive and free convective heat transfer from the components to the cooling structure (e.g., vapor-condenser) due to the "all-liquid" encapsulation with minimal low-conductivity vapor or expansion space within the fluid-tight compartment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
   a housing at least partially surrounding and forming a fluid-tight compartment about at least one electronic component;
   a boiling fluid mixture comprising a first dielectric fluid and a second dielectric fluid disposed within the fluid-tight compartment, the at least one electronic component being immersed within the boiling fluid mixture;
   a condensing fluid disposed within the fluid-tight compartment, the condensing fluid and the boiling fluid mixture being immiscible, and the condensing fluid comprising a lower specific gravity than that of the boiling fluid mixture, and a higher thermal conductivity than that of the boiling fluid mixture, and wherein the condensing fluid facilitates condensing of vaporized boiling fluid mixture within the fluid-tight compartment; and
   a cooling structure disposed within the fluid-tight compartment, the cooling structure comprising a condensing region and a sub-cooling region, the condensing region being in contact with the condensing fluid, and the sub-cooling region being in contact with the boiling fluid mixture, wherein the cooling structure facilitates heat removal from the fluid-tight compartment.

2. The cooling apparatus of claim 1, wherein the first dielectric fluid and the second dielectric fluid are miscible, and the condensing fluid comprises a higher specific heat than that of the boiling fluid mixture.

3. The cooling apparatus of claim 1, wherein the boiling fluid mixture comprises a selected boiling temperature, and comprises percentages of the first dielectric fluid and the second dielectric fluid which ensure the selected boiling temperature of the boiling fluid mixture.

4. The cooling apparatus of claim 1, wherein the cooling structure comprises a plurality of thermally conductive fins extending within the fluid-tight compartment, and wherein at least one thermally conductive fin of the plurality of thermally conductive fins comprises the condensing region and the sub-cooling region.

5. The cooling apparatus of claim 4, wherein the cooling structure further comprises at least one coolant-carrying channel extending within the fluid-tight compartment and in thermal communication with the plurality of thermally conductive fins.

6. The cooling apparatus of claim 4, wherein the cooling structure further comprises a plurality of air-cooled fins extending external to the housing, the plurality of air-cooled fins facilitating dissipation of heat removed from the fluid-tight compartment, via the plurality of thermally conductive fins, to air external the housing.

7. The cooling apparatus of claim 4, wherein the at least one electronic component is disposed on a substrate oriented vertically, and the housing comprises a sloped side wall opposite to the substrate, and sloped outward from a lower region to an upper region of the fluid-tight compartment, and wherein the plurality of thermally conductive fins of the cooling structure extend into the fluid-tight compartment from the sloped side wall of the housing.

8. The cooling apparatus of claim 7, wherein the at least one thermally conductive fin of the plurality of thermally conductive fins comprises a substantially triangular-shaped fin with an edge in spaced, opposing relation to the at least one electronic component disposed on the vertically-oriented substrate.

9. The cooling apparatus of claim 7, wherein the sloped side wall of the housing is configured to facilitate entraining of condensing fluid within the boiling fluid mixture to facilitate contact condensation of vaporized boiling fluid mixture within the fluid-tight compartment.

10. The cooling apparatus of claim 7, wherein the cooling structure further comprises at least one coolant-carrying channel coupled in thermal communication with the plurality of thermally conductive fins, the at least one coolant-carrying channel facilitating passage of liquid coolant through the cooling structure to facilitate dissipation of heat removed from the fluid-tight compartment, via the plurality of thermally conductive fins, to the liquid coolant flowing therethrough.

11. The cooling apparatus of claim 7, wherein the cooling structure further comprises a plurality of air-cooled fins extending external to the housing, the plurality of air-cooled fins facilitating dissipation of heat removed from the fluid-tight compartment, via the plurality of thermally conductive fins, to air external the housing.

12. The cooling apparatus of claim 11, further comprising at least one coolant-carrying channel disposed external the housing and in thermal communication with the plurality of air-cooled fins extending external to the housing, the at least one coolant-carrying channel facilitating dissipation of heat removed from the fluid-tight compartment, via the plurality of thermally conductive fins, to a coolant flowing therethrough.

13. The cooling apparatus of claim 11, wherein the cooling structure further comprises at least one coolant-carrying channel extending within the fluid-tight compartment and coupled in thermal communication with the plurality of thermally conductive fins, the at least one coolant-carrying channel facilitating dissipation of heat removed from the fluid-tight compartment, via the plurality of thermally conductive fins, to a coolant flowing therethrough.

14. A liquid-cooled electronic system comprising:
   an electronics rack comprising at least one electronic component to be cooled; and
   a cooling apparatus immersion-cooling the at least one electronic component, the cooling apparatus comprising:
      a housing at least partially surrounding and forming a fluid-tight compartment about the at least one electronic component;
      a boiling fluid mixture comprising a first dielectric fluid and a second dielectric fluid disposed within the fluid-tight compartment, the at least one electronic component being immersed within the boiling fluid mixture;
      a condensing fluid disposed within the fluid-tight compartment, the condensing fluid and the boiling fluid mixture being immiscible, and the condensing fluid comprising a lower specific gravity than that of the boiling fluid mixture, and a higher thermal conductivity than that of the boiling fluid mixture, and wherein the condensing fluid facilitates condensing of vaporized boiling fluid mixture within the fluid-tight compartment; and
      a cooling structure disposed within the fluid-tight compartment, the cooling structure comprising a condensing region and a sub-cooling region, the condensing region being in contact with the condensing fluid, and the sub-cooling region being in contact with the boiling fluid mixture, wherein the cooling structure facilitates heat removal from the fluid-tight compartment.

15. The liquid-cooled electronic system of claim 14, wherein the first dielectric fluid and the second dielectric fluid are miscible, and the condensing fluid comprises a higher specific heat than that of the boiling fluid mixture.

16. The liquid-cooled electronic system of claim 14, wherein the boiling fluid mixture comprises a selected boiling temperature, and comprises percentages of the first dielectric fluid and the second dielectric fluid which ensure the selected boiling temperature of the boiling fluid mixture.

17. The liquid-cooled electronic system of claim 14, wherein the cooling structure comprises a plurality of thermally conductive fins extending within the fluid-tight compartment, and at least one thermally conductive fin of the plurality of thermally conductive fins comprises the condensing region and the sub-cooling region, and wherein the cooling structure further comprises at least one coolant-carrying channel extending within the fluid-tight compartment and in thermal communication with the plurality of thermally conductive fins.

18. The liquid-cooled electronic system of claim 14, wherein the cooling structure comprises a plurality of thermally conductive fins extending within the fluid-tight compartment, and at least one thermally conductive fin of the plurality of thermally conductive fins comprises the condensing region and the sub-cooling region, and wherein the cooling structure further comprises a plurality of air-cooled fins extending external to the housing, the plurality of air-cooled fins facilitating dissipation of heat removed from the fluid-tight compartment, via the plurality of thermally conductive fins, to air external the housing.

19. The liquid-cooled electronic system of claim 14, wherein the electronics rack comprises an air inlet side and an air outlet side, the air inlet side and the air outlet side respectively enabling ingress and egress of air through the electronics rack, and wherein the liquid-cooled electronic system further comprises an air-to-liquid heat exchanger associated with the air outlet side of the electronics rack, the air-to-liquid heat exchanger facilitating cooling of air passing through the electronics rack, and wherein the cooling structure comprises a plurality of air-cooled fins extending external to the housing and within the electronics rack, the plurality of air-cooled fins being cooled by air passing through the electronics rack, and wherein heat dissipated to air from the cooling structure is transferred via the air egressing from the electronics rack and the air-to-liquid heat exchanger associated with the air outlet side of the electronics rack to liquid coolant flowing through the air-to-liquid heat exchanger.

20. A method of facilitating cooling of at least one electronic component, the method comprising:
 providing a housing at least partially surrounding and forming a fluid-tight compartment about the at least one electronic component to be cooled;
 providing a boiling fluid mixture comprising a first dielectric fluid and a second dielectric fluid that comprises a desired boiling temperature, the first dielectric fluid and the second dielectric fluid being miscible;
 immersing the at least one electronic component within the boiling fluid mixture;
 providing a condensing fluid disposed within the fluid-tight compartment, the condensing fluid and the boiling fluid mixture being immiscible, and the condensing fluid comprising a lower specific gravity than that of the boiling fluid mixture, and a higher thermal conductivity than that of the boiling fluid mixture, and wherein the condensing fluid facilitates condensing of vaporized boiling fluid mixture within the fluid-tight compartment; and
 providing a cooling structure disposed within the fluid-tight compartment, the cooling structure comprising a condensing region and a sub-cooling region, the condensing region being in contact with the condensing fluid, and the sub-cooling region being in contact with the boiling fluid mixture, wherein the cooling structure facilitates heat removal from the fluid-tight compartment.

\* \* \* \* \*